US008288657B2

(12) United States Patent
Choi et al.

(10) Patent No.: US 8,288,657 B2
(45) Date of Patent: Oct. 16, 2012

(54) NOISE COUPLING REDUCTION AND IMPEDANCE DISCONTINUITY CONTROL IN HIGH-SPEED CERAMIC MODULES

(75) Inventors: Jinwoo Choi, Austin, TX (US); Sungjun Chun, Austin, TX (US); Anand Haridass, Nagawara (IN); Roger Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 376 days.

(21) Appl. No.: 12/577,259

(22) Filed: Oct. 12, 2009

(65) Prior Publication Data
US 2011/0083888 A1 Apr. 14, 2011

(51) Int. Cl.
*H05K 1/00* (2006.01)
(52) U.S. Cl. ........ 174/258; 174/250; 174/261; 174/262; 174/264
(58) Field of Classification Search .............. 174/250, 174/255, 258, 262, 261, 264, 266; 257/207, 257/208, 692, 659; 361/784, 792
See application file for complete search history.

(56) References Cited

U.S. PATENT DOCUMENTS

| | | | |
|---|---|---|---|
| 4,811,082 A | 3/1989 | Jacobs et al. | |
| 4,866,507 A | 9/1989 | Jacobs et al. | |
| 5,272,600 A | 12/1993 | Carey | |
| 5,288,949 A | 2/1994 | Crafts | |
| 5,329,498 A | 7/1994 | Greenstein | |
| 5,508,938 A * | 4/1996 | Wheeler | 716/112 |
| 5,726,863 A * | 3/1998 | Nakayama et al. | 361/794 |
| 6,353,189 B1 * | 3/2002 | Shimada et al. | 174/255 |
| 6,442,041 B2 * | 8/2002 | Rehm et al. | 361/760 |
| 6,483,714 B1 | 11/2002 | Kabumoto et al. | |

(Continued)

FOREIGN PATENT DOCUMENTS
JP 6053351 A1 2/1994
(Continued)

OTHER PUBLICATIONS

"Modeling and Experimental Verification of the Interconnected Mesh Power System (IMPS) MCM Topology" by Yee L. Low and Leonard W. Schaper: IEEE Transactions on Components, Packaging, and Manufacturing Technology—Part B, vol. 20, No. 1, Feb. 1997, pp. 42-49.

(Continued)

*Primary Examiner* — Angel R Estrada
*Assistant Examiner* — Dimary Lopez
(74) *Attorney, Agent, or Firm* — Yudell Isidore Ng Russell PLLC

(57) ABSTRACT

An improved multi-layered ceramic package comprises: a plurality of signal layers, each having one or more signal lines; a plurality of vias, each providing one of a voltage (Vdd) power connection or a ground (Gnd) connection; at least one reference mesh layer adjacent to one or more signal layers; and a plurality of via-connected coplanar-type shield (VCS) lines, with a first VCS line extending on a first side of a first signal line within the plurality of signal layers and a second VCS line extending on a second opposing side of the first signal line. Each of the plurality of VCS lines interconnect with and extend past one or more vias that are located along the directional path in which the VCS lines runs. The placement of the VCS lines relative to the signal lines reduces coupling noise and controls impedance discontinuity in the ceramic package.

13 Claims, 9 Drawing Sheets

U.S. PATENT DOCUMENTS

| | | | |
|---|---|---|---|
| 6,510,545 B1 | 1/2003 | Yee et al. | |
| 6,657,130 B2 * | 12/2003 | Van Dyke et al. | 174/255 |
| 6,707,685 B2 | 3/2004 | Kabumoto et al. | |
| 6,800,939 B2 | 10/2004 | Schaper | |
| 7,176,383 B2 | 2/2007 | Lauffer et al. | |
| 7,436,008 B2 | 10/2008 | Ho | |
| 7,465,882 B2 | 12/2008 | Becker et al. | |
| 7,492,234 B2 | 2/2009 | Hsu et al. | |
| 7,943,436 B2 * | 5/2011 | McElvain | 438/129 |
| 8,028,406 B2 * | 10/2011 | Ding et al. | 29/846 |
| 2001/0013422 A1 | 8/2001 | Schaper | |
| 2004/0145033 A1 | 7/2004 | McElvain | |
| 2006/0214190 A1 | 9/2006 | Chun et al. | |
| 2011/0061898 A1 * | 3/2011 | Mutnury et al. | 174/250 |

FOREIGN PATENT DOCUMENTS

| | | |
|---|---|---|
| JP | 09-018156 A | 1/1997 |
| JP | 2001-085848 A | 3/2001 |
| JP | 2001-085849 A | 3/2001 |
| JP | 2002-033556 A | 1/2002 |
| KR | 1020040014473 A | 2/2004 |

OTHER PUBLICATIONS

IPCOM000099984D: "Highly Shielded Signal Lines for MLC/MCM Carriers" by Klink et al.: Technical Disclosure Bulletin (TDB) n10a, Mar. 15, 1990, pp. 166-168.

* cited by examiner

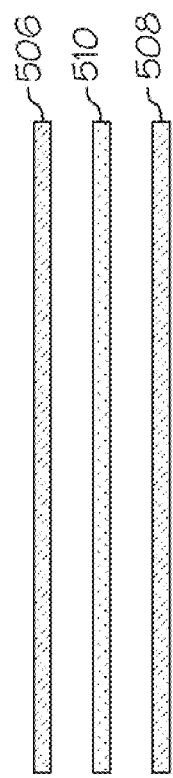
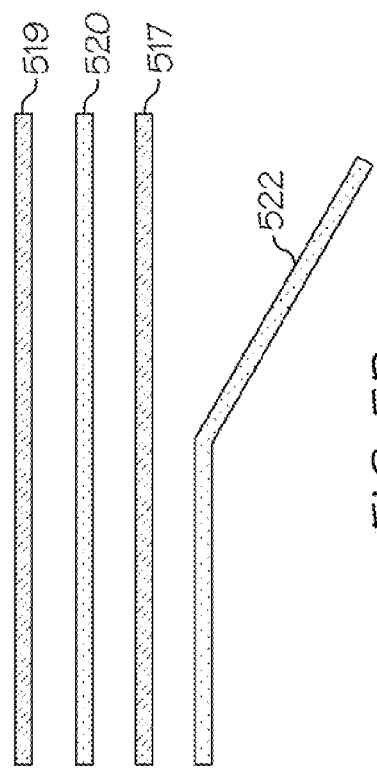
FIG. 5C
FIG. 5D
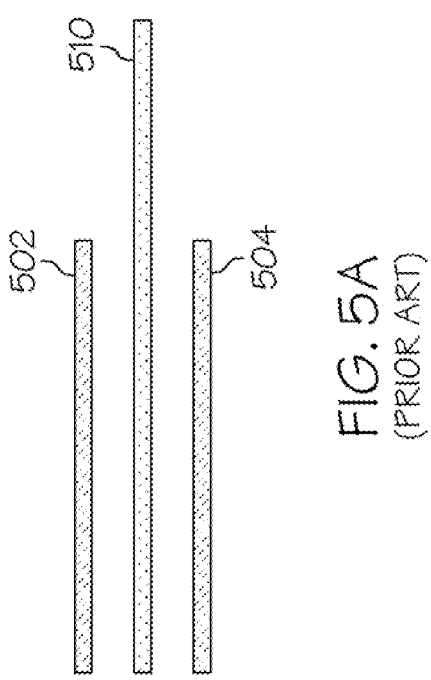
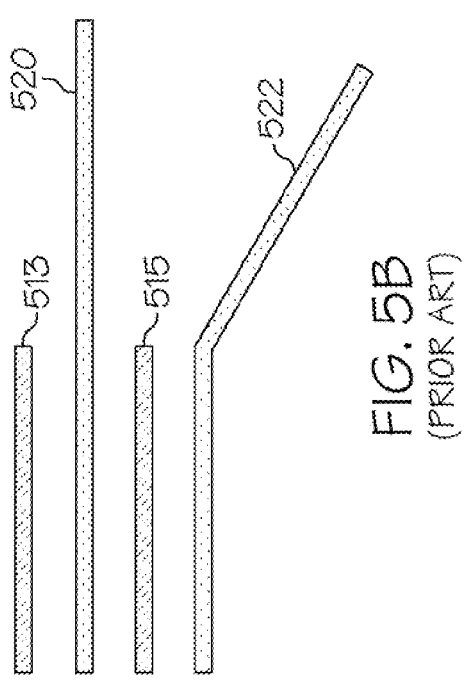
FIG. 5A
(PRIOR ART)
FIG. 5B
(PRIOR ART)

NOISE COUPLING REDUCTION AND IMPEDANCE DISCONTINUITY CONTROL IN HIGH-SPEED CERAMIC MODULES

BACKGROUND

1. Technical Field

The present invention generally relates to integrated circuit packaging and in particular to an improved ceramic package. Still more particularly, the present invention relates to methods for designing and fabricating ceramic packages that exhibit reduced noise coupling between signal traces and optimizes impedance discontinuity control.

2. Description of the Related Art

Crosstalk is a phenomenon by which some of the energy carried by a signal on one line/trace is transferred to a nearby line/trace. A signal net with a source of noise is called an aggressor net or an active net and the net on which the noise is generated is called the victim net or the quiet net. Crosstalk occurs because of capacitive and inductive coupling between the signal lines in electrical circuits. Crosstalk may cause noise to be generated on the adjacent quiet signal lines, which could lead to false logic switching. Crosstalk may also impact the timing on the active lines if multiple lines are switching simultaneously.

Ceramic packages have been popularly used in wide range of applications with excellent reliability and a large number of wiring capabilities. Signal speeds and the number of the signal inputs/outputs (I/Os) have increase rapidly in recent applications of ASICs; However, high noise coupling among those high speed signals has become a critical concern in ceramic packages and has severely limited the application space for ceramic packages. One mechanism for reducing noise coupling in ceramic packages proposes the use of metal fillings in mesh planes. However, this noise reduction mechanism may significantly increase the amount of metal in the layer and is limited in real ceramic package applications, which have limits for metal loading for each metal layer in ceramic packages.

BRIEF SUMMARY

Disclosed is a multi-layered ceramic package which substantially reduces noise coupling and substantially eliminates impedance discontinuity. Also disclosed are a method and system for making the improved ceramic package. The ceramic package comprises: a plurality of signal layers, each having one or more signal lines; a plurality of vias, each providing one of a voltage (Vdd) power connection or a ground (Gnd) connection; at least one reference mesh layer adjacent to one or more signal layers; and a plurality of via-connected coplanar-type shield (VCS) lines, with a first coplanar shield line extending on a first side of a first signal line within the plurality of signal layers and a second coplanar shield line extending on a second opposing side of the first signal line. Each of the plurality of VCS lines interconnects with and extend past one or more vias of the plurality of vias located within a directional path in which the VCS line extends. The length and placement of the VCS lines relative to the signal lines reduces coupling noise and controls impedance discontinuity in the ceramic package.

The above as well as additional objectives, features, and advantages of the present invention will become apparent in the following detailed written description.

BRIEF DESCRIPTION OF THE SEVERAL VIEWS OF THE DRAWINGS

The invention itself, as well as advantages thereof, will best be understood by reference to the following detailed description of illustrative embodiments when read in conjunction with the accompanying drawings, wherein:

FIGS. 5A, 5C and 5B, 5D illustrate two comparative configurations in which shield lines are utilized within ceramic packages to shield adjacent signal lines, when applied without shield lines of at least a threshold minimum length and with the methodology which includes VCS lines of at least the threshold minimum length, according to one embodiment;

DETAILED DESCRIPTION

Figure 1:
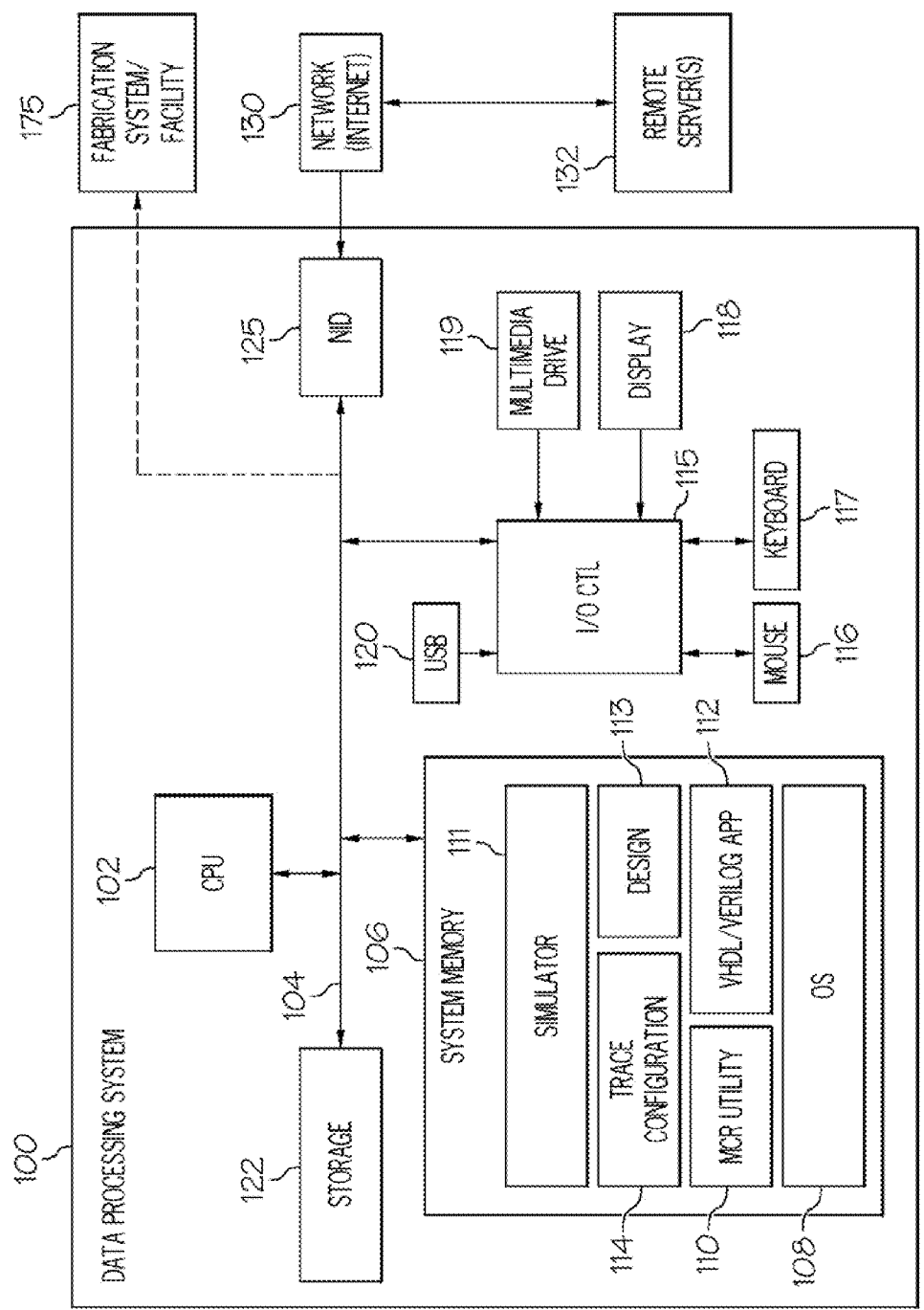
FIG. 1 provides a block diagram representation of an example data processing system within which features of one embodiment may be implemented.

The illustrative embodiments provide an improved multi-layered ceramic package comprises: a plurality of signal layers, each having one or more signal lines; a plurality of vias, each providing one of a voltage (Vdd) power connection or a ground (Gnd) connection; at least one reference mesh layer adjacent to one or more signal layers; and a plurality of via-connected coplanar-type shield (VCS) lines, with a first coplanar shield line extending on a first side of a first signal line within the plurality of signal layers and a second coplanar shield line extending on a second opposing side of the first signal line. Each of the plurality of VCS lines interconnects with and extend past one or more vias located within the directional path in which the VCS line runs. The length and placement of the VCS lines relative to the signal lines reduces coupling noise and controls impedance discontinuity in the ceramic package.

Additionally, the embodiments further provide a method, a system/device and a computer program product for reducing coupling noise and controlling impedance discontinuity in ceramic packages/modules used for integrated circuit devices. During design/processing of a multi-layered ceramic package, a Module Crosstalk Reduction (MCR) utility executing within the processing device inspects a configuration of signal nets to determine a spatial arrangement of reference vias. The MCR utility calculates a maximum threshold spacing between adjacent vias. In order to avoid the generation of resonance between adjacent vias, the MCR utility selects a layout arrangement for the pitch of the mesh layers which separates adjacent vias by less than the periodic threshold spacing. This layout arrangement is provided as the pitch of the mesh layer, with the vias located in the holes provided within the mesh layer. The mesh layer pitch (i.e., the distance between mesh lines) is a design parameter which is variable based on a plurality of factors, with the need for the pitch to allow for near placement of vias relative to each other to avoid resonance being one such factor. The MCR utility determines the threshold length of coplanar shield lines and selects the length of the coplanar shield lines to be no less than the threshold length and no less than the length of signal traces. By selecting a parallel placement of the coplanar shield lines on both sides and along the entire length of a signal trace, the MCR utility reduces coupling noise and controls impedance discontinuity in the resulting ceramic package. The various parameters evaluated by the MCR utility are then forwarded to the fabrication process for generation/fabrication of the ceramic package.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

Within the descriptions of the figures, similar elements are provided similar names and reference numerals as those of the previous figure(s). Where a later figure utilizes the element in a different context or with different functionality, the element is provided a different leading numeral representative of the figure number. The specific numerals assigned to the elements are provided solely to aid in the description and not meant to imply any limitations (structural or functional or otherwise) on the described embodiment.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized.

With reference now to the figures, and beginning with FIG. 1, there is depicted a block diagram representation of an example data processing system (DPS). DPS 100 may be utilized within the described embodiments related to the method, program product and system for designing the ceramic package having the functional characteristics desired, including substantially reduced noise coupling (i.e., reduced crosstalk), improving/controlling impedance discontinuities, and preventing undesirable resonance in the ceramic package/module. DPS 100 may be a computer, or any other type of electronic devices that may generally be considered a processing device. As illustrated, DPS 100 comprises at least one processor or central processing unit (CPU) 102 connected to system memory 106 via system interconnect/bus 104. Also connected to system bus 104 is input/output (I/O) controller 115, which provides connectivity and control for input devices, of which pointing device (or mouse) 116 and keyboard 117 are illustrated. I/O controller 115 also provides connectivity and control for output devices, of which display 118 is illustrated. Additionally, a multimedia drive 119 (e.g., compact disk read/write (CDRW) or digital video disk (DVD) drive) and USB (universal serial bus) port 120 are illustrated, coupled to I/O controller 115. Multimedia drive 119 and USB port 120 enable insertion of a removable storage device (e.g., optical disk or "thumb" drive) on which data/instructions/code may be stored and/or from which data/instructions/code may be retrieved. DPS 100 also comprises storage 122, within/from which data/instructions/code may also be stored/retrieved. DPS 100 is also illustrated with a network interface device (NID) 125, by which DPS 100 may connect to one or more remote servers 132 via one or more access/external networks 130, of which the Internet is provided as one example. Finally, DPS 100 is illustrated coupled to fabrication facility/system 175, which generally represents the facility at which the ceramic package, which is designed using software code executing on DPS 100, is actually fabricated. Fabrication facility 175 is not necessarily coupled to DPS 100, and the design 113 generated by DPS 100 may be stored on a removable medium or transmitted via external network 130 to a separate, remote fabrication facility.

In addition to the above described hardware components of DPS 100, various ceramic package design features are completed/supported via software (or firmware) code or logic stored within memory 106 or other storage (e.g., storage 122) and executed by CPU 102. Thus, for example, illustrated within memory 106 are a number of software/firmware/logic components, including operating system (OS) 108 (e.g., Microsoft Windows®, a trademark of Microsoft Corp, or GNU®/Linux®, registered trademarks of the Free Software Foundation and The Linux Mark Institute), Very High Speed Integrated Circuits Hardware Description Language (VHDL)/Verilog application 112, simulator 111, trace configuration 114 and Module Crosstalk Reduction (MCR) utility 110. Also included in memory 106 is (electrical) design 113. In actual implementation, MCR utility 110 may be combined with one or more other software modules, including VHDL/Verilog application 112, design 113 and trace configuration 114, to provide a single executable component, collectively providing the various functions of each individual software component when the corresponding combined code of the executable component is executed by the CPU 102. For simplicity, MCR utility 110 is illustrated and described as a standalone or separate software/firmware component/module, which provides specific functions, as described below. As a standalone component/module, MCR utility 110 may be acquired as an off-the-shelf or after-market enhancement to existing program applications, such as VHDL/Verilog application 112. In at least one implementation, MCR utility 110 may be downloaded from a server or website (e.g., remote server 132), and installed on DPS 100 or executed from the server.

CPU 102 executes MCR utility 110 as well as OS 108, which supports the user interface features of MCR utility 110, such as generation of a graphical user interface (GUI), where GUI generation is supported/provided by MCR utility 110. In one embodiment, MCR utility 110 generates/provides one or more GUIs to enable user interaction with, or manipulation of, functional features of MCR utility 110.

Certain of the functions supported and/or provided by MCR utility/logic 110 are enabled as processing logic (or code) executing on DSP/CPU 102 and/or other device hardware, which processing logic completes the implementation of those function(s). Among the software code/instructions/logic provided by MCR utility 110, and which are specific to the described embodiments of the invention, are: (a) code/logic for determining a periodic threshold spacing between adjacent reference vias in a trace layout of the particular ceramic package being designed; (b) code/logic for selecting a trace layout arrangement (i.e., a pitch of the mesh layers of the ceramic package) which separates adjacent vias by less than the maximum threshold spacing; (c) code/logic for determining the threshold length of coplanar shield lines; and (d) code/logic for reducing coupling noise and controlling impedance discontinuity by selecting a placement and length of the coplanar shield lines on both sides of one or more signal traces, with a minimum length greater than or equal to the threshold length of coplanar shield lines. Once MCR utility 110 completes the functional processes of determining the relative locations and lengths of components that make up the ceramic package, the particular design parameters are stored as design 113 and/or transmitted to fabrication facility/system 175 for fabrication of the improved ceramic package (see FIGS. 3 and 4).

Figure 6A:
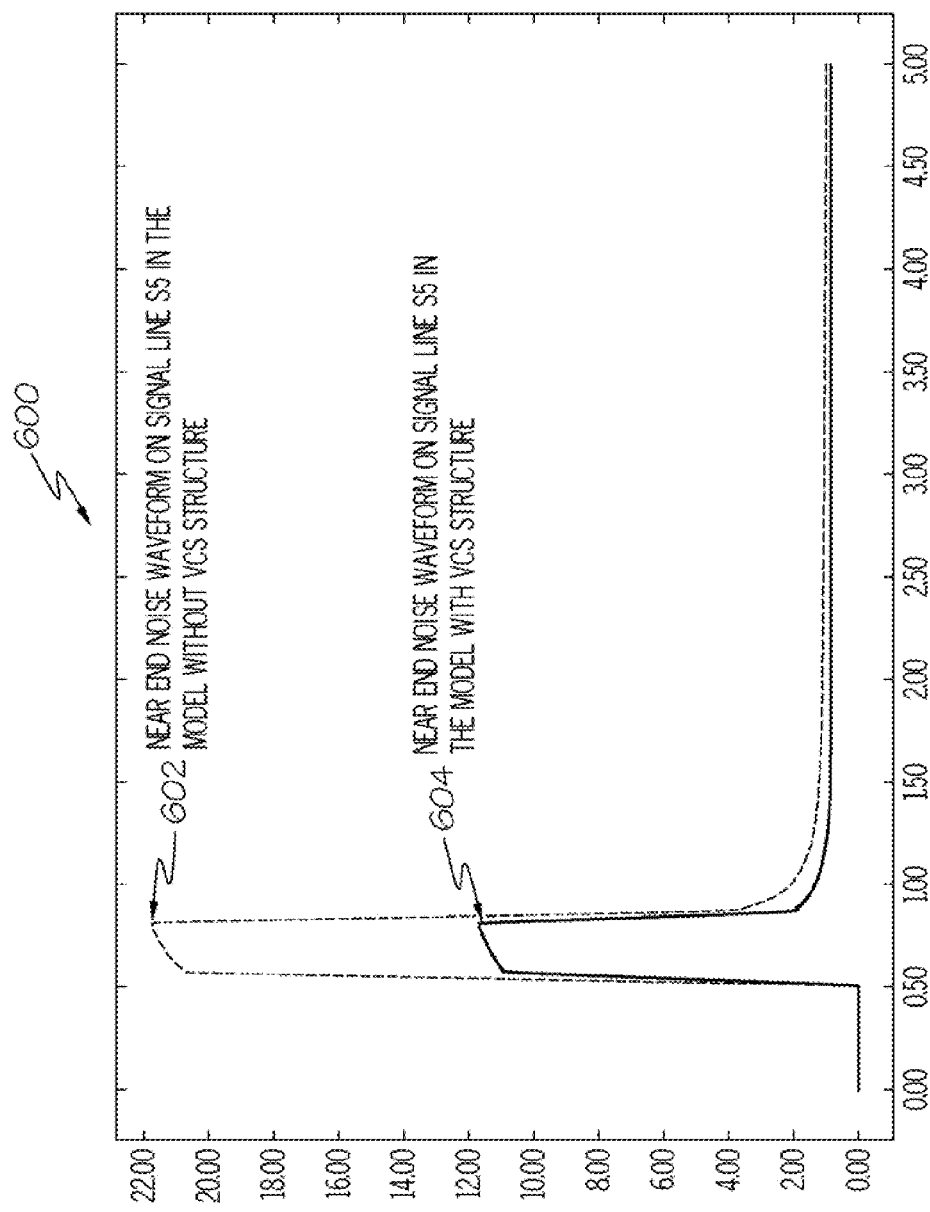
FIGS. 6A-6B provides two graphs respectively illustrating NE (near end) noise waveforms and FE (far end) noise waveforms on the victim signal net due to all 8 aggressor nets for two design models, one without and one with the VCS structure, according to one embodiment.
Figure 6B:
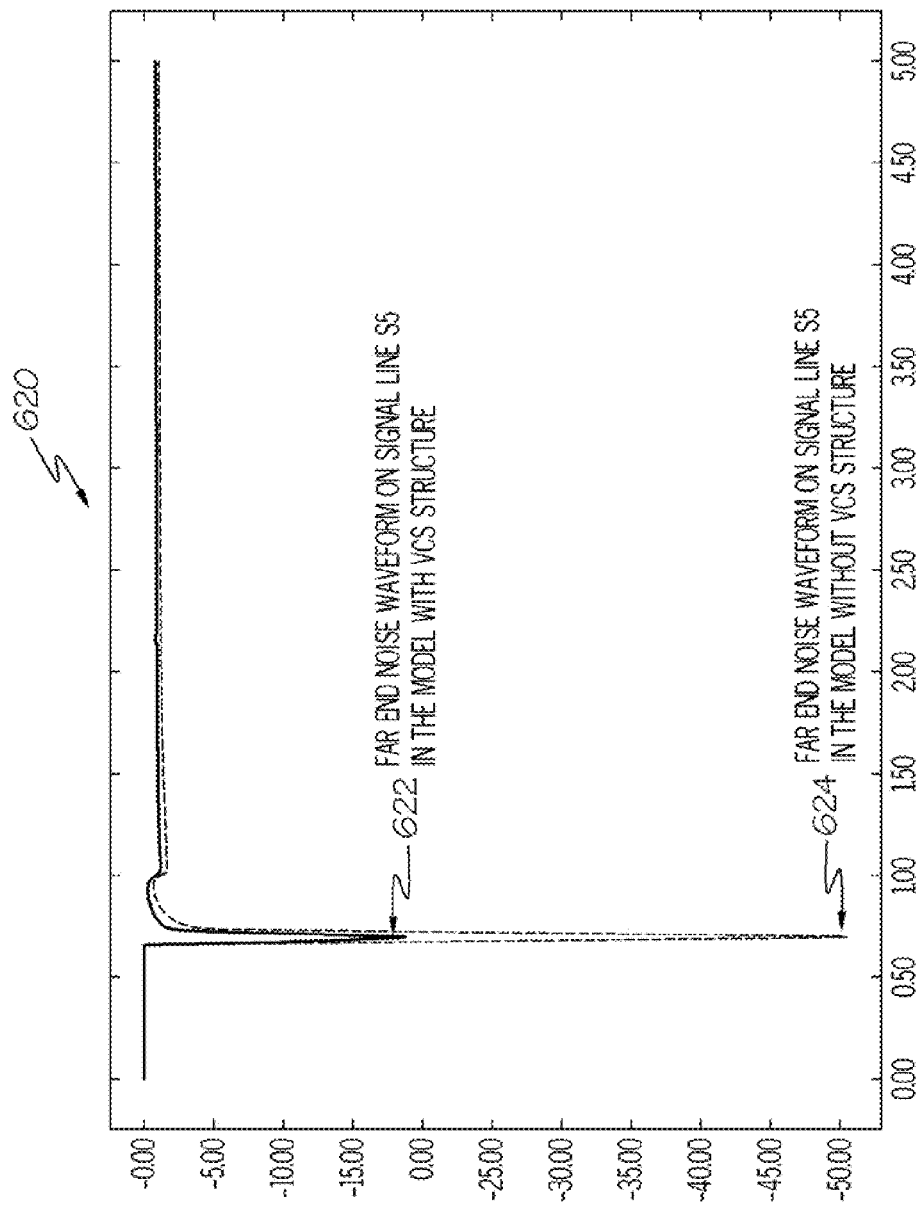
Figure 7:
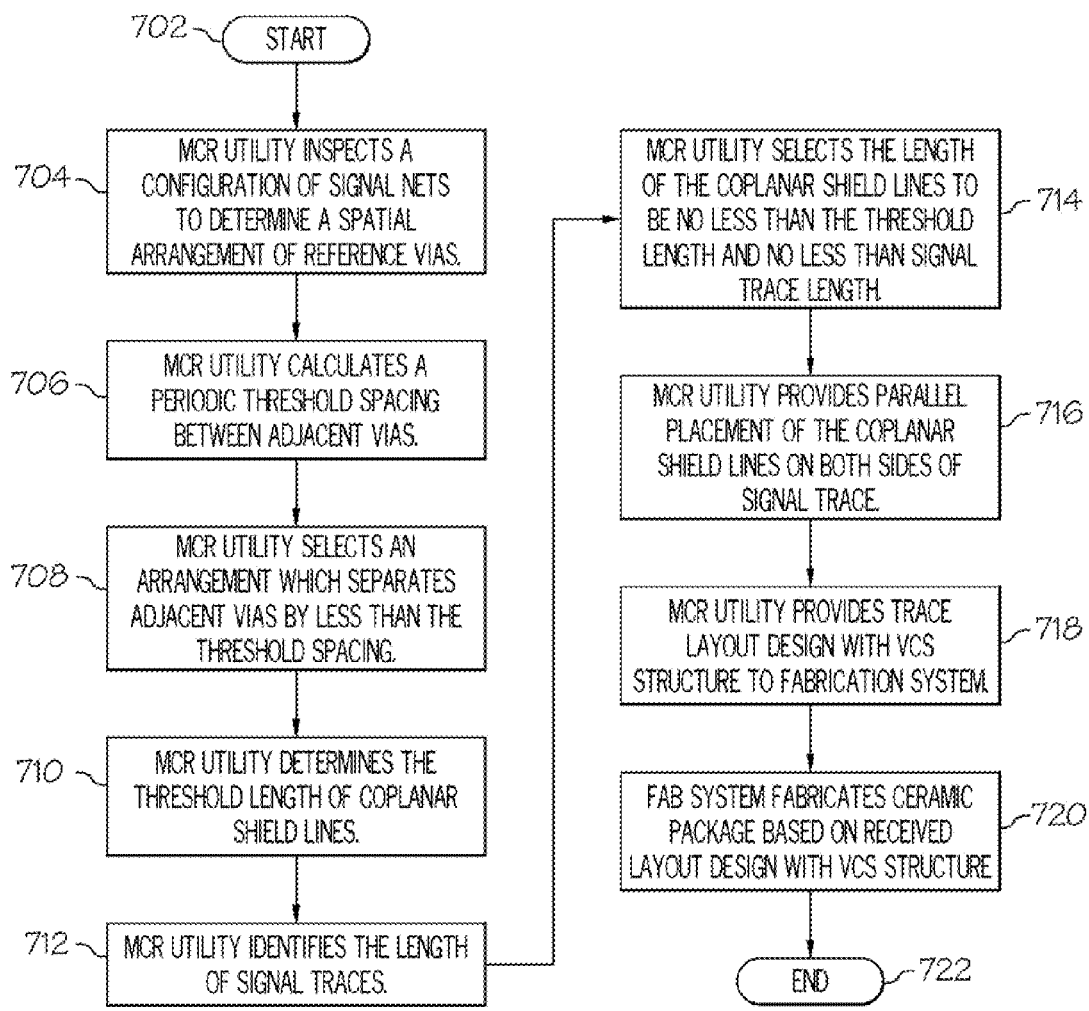
FIG. 7 is a flow chart illustrating the process of designing and fabricating a ceramic package to exhibit reduced coupling noise and allow for control of impedance discontinuity utilizing the VCS structure, according to one embodiment.

According to the illustrative embodiments, when CPU 102 executes MCR utility 110, CPU 102/DPS 100 initiates a series of functional processes that enable the above functional features as well as additional features/functionality (see FIG. 7, for example). These features/functionality are described in greater detail below within the description of FIGS. 3-7. Specifically, the utilization of the VCS lines within a ceramic package is illustrated using the three-dimensional trace configuration of FIG. 3 and the corresponding cross sectional representation depicted in FIGS. 4A-4B, described below. The correction and/or control of impedance discontinuity and relative reduction in coupling noise associated with ceramic packages designed with VCS structures are illustrated by FIGS. 5 and 6. Finally, the processes by which MCR utility 110 determines the placement and dimensions of vias, signal lines and VCS lines relative to each other during a design stage of a VCS-configured ceramic package to provide the improved functional characteristics described herein is illustrated by FIG. 7.

Those of ordinary skill in the art will appreciate that the hardware components and/or basic configuration depicted in FIG. 1 (and the configurations depicted within other figures presented herein) may vary. The illustrative components within these figures (e.g., DPS 100) are not intended to be exhaustive, but rather are representative to highlight essential components that are utilized to implement one embodiment of the present invention. For example, other devices/components may be used in addition to or in place of the hardware depicted. The depicted example is not meant to imply architectural or other limitations with respect to the presently described embodiments and/or the general invention. The data processing system depicted in FIG. 1 may be, for example, an IBM eServer pSeries system, a product of International Business Machines Corporation in Armonk, N.Y., running the Advanced Interactive Executive (AIX) operating system or LINUX operating system.

Figure 2:
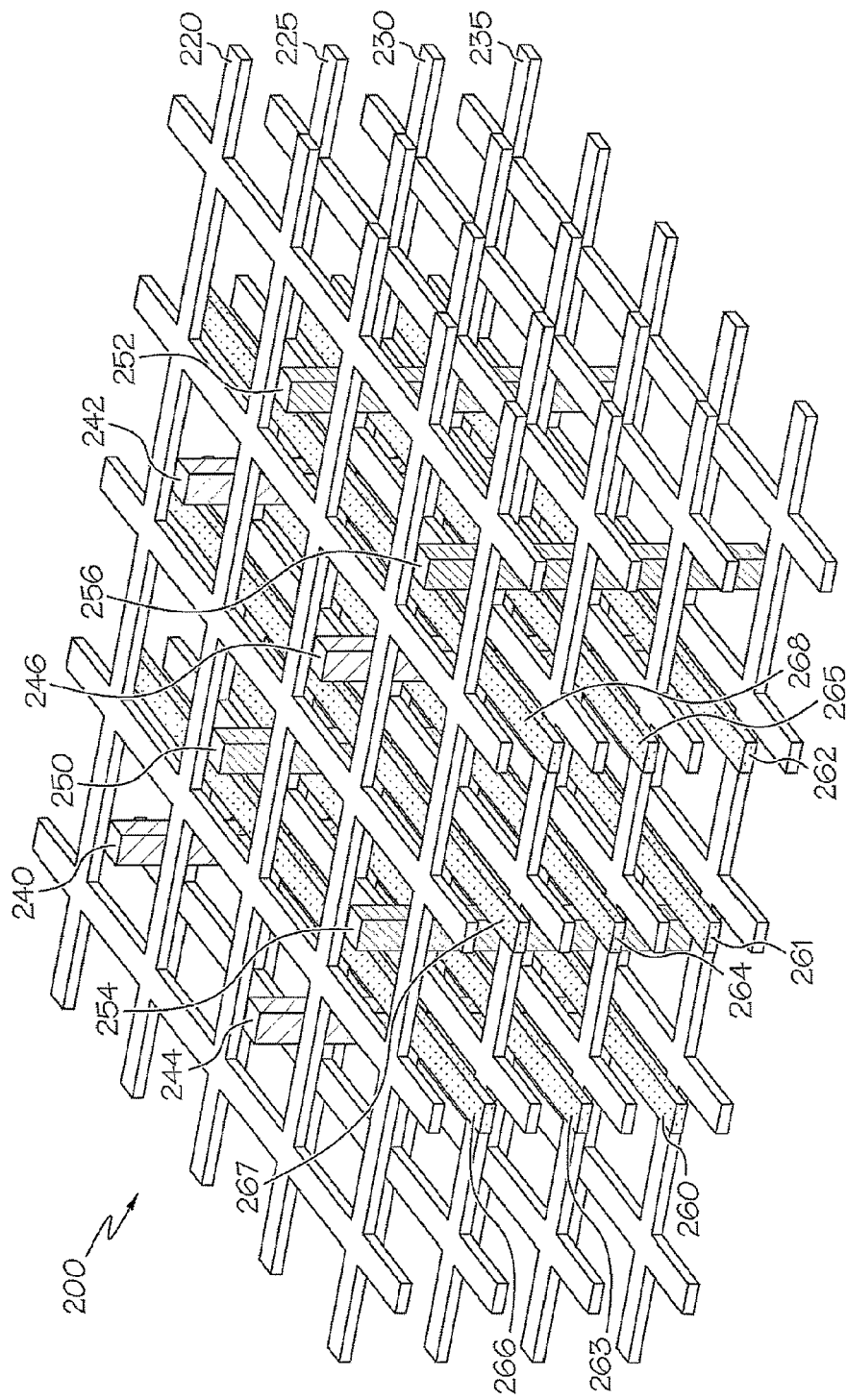
FIG. 2 illustrates a three dimensional view of a conventional ceramic package designed according to the prior art.

Turning now to FIG. 2, there is illustrated a conventional model/design of a three dimensional ceramic package. As shown, this conventional ceramic package 200 comprises: four mesh layers/planes 220, 225, 230, 235; a plurality of signal (trace) layers (three shown) with signal lines 260-267 running interspersed between the mesh layers/planes 220, 225, 230, 235; and a plurality of ground (Gnd) vias 240-246 and voltage (Vdd) power vias 250-256 extending through the mesh layers 220, 225, 230, 235. Notably, with this conventional model/design of conventional ceramic package 200, issues of coupling noise/crosstalk between adjacent signal nets, impedance discontinuity, and resonance within the ceramic packaging are common, though undesirable.

Figure 3:
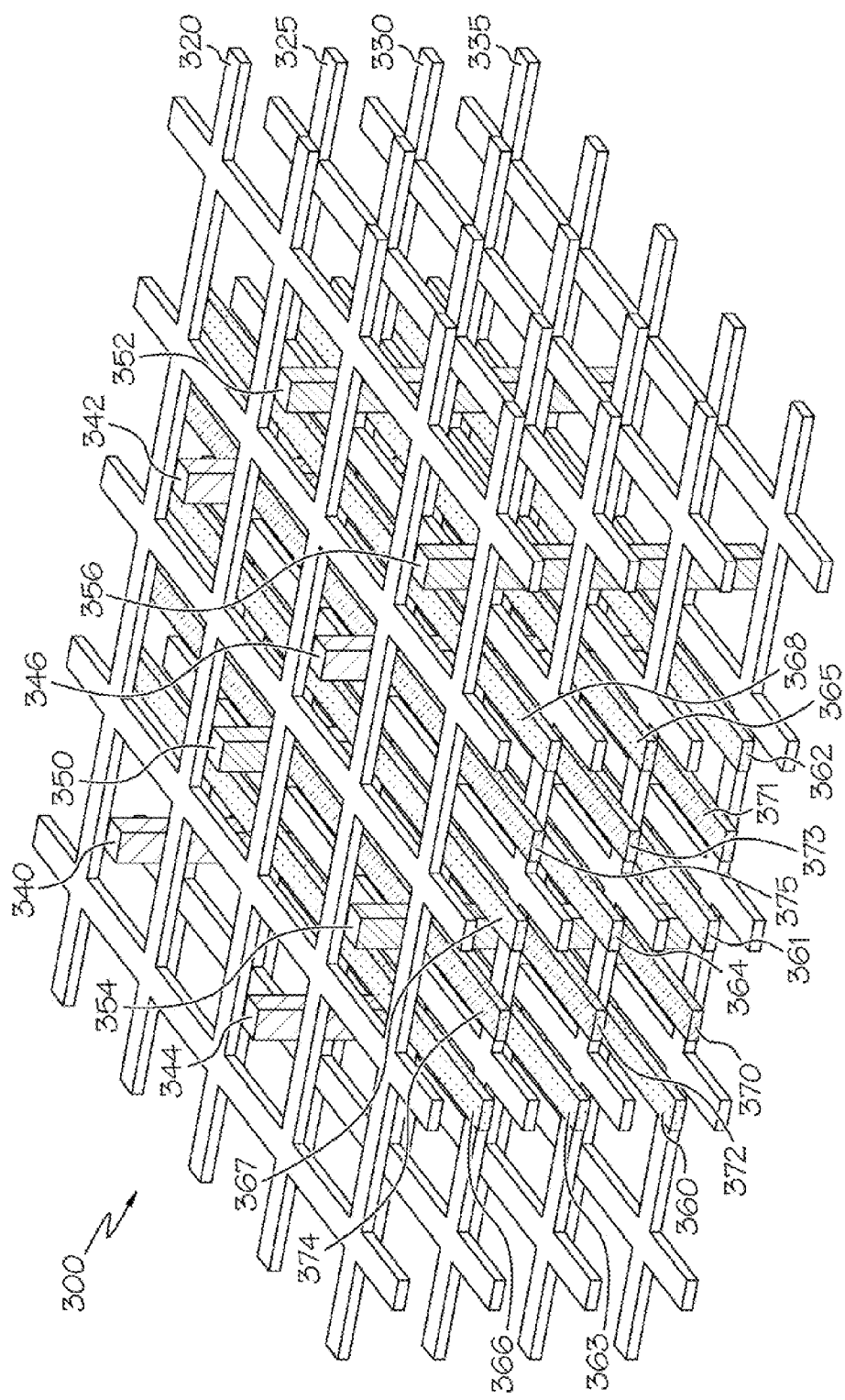
FIG. 3 illustrates a three dimensional view of an improved ceramic package having a plurality of via-connected coplanar-type shield (VCS) lines inserted therein, in accordance with one embodiment.

FIG. 3 illustrates an example of a three-dimensional high speed ceramic package designed/fabricated with Via-connected Coplanar-type Shield (VCS) structures, according to one illustrative embodiment. Ceramic package 300 comprises four mesh layers/planes, generally represented as mesh planes 320, 325, 330, and 335. Interspersed between these mesh planes are three signal (trace) layers, first, second and third signal layer, each separated from the other by a mesh plane. First signal layer comprises three signal traces/lines, S1 trace 360, S2 trace 361 and S3 trace 362. Second signal layer comprises S4 trace 363, S5 victim trace 364 and S6 trace 365. Third signal layer comprises S7 trace 366, S8 trace 367 and S9 trace 368. In one embodiment, the signal traces of the first signal layer, second signal layer, and third signal layer connect a first integrated circuit (IC) to a second IC (neither of which are explicitly illustrated). Also illustrated in ceramic package 300 are a plurality of ground (Gnd) vias 340-346 and voltage (Vdd) power vias 350-356. Finally, at periodic locations, a plurality of via-connected coplanar-type shield (VCS) structures/lines 370-375 extend in a parallel direction (or orthogonally across different signal layers) along the entire length of signal lines and connect to one or more vias located in the path (or along the directional plane) in which the VCS line runs. The specific location of these VCS lines 370-375 within ceramic package 300 as well as the length of the VCS lines 370-375 are determined by a sequence of processes (see FIG. 7) completed by MCR utility 110 (FIG. 1).

Notably, conventional ceramic package 200 (FIG. 2) does not include the VCS structures of ceramic package 300. Thus, conventional ceramic package 200 (and by extension integrated circuit (IC) devices designed using ceramic package 200) does not achieve the noise reduction, impedance control and other benefits of ceramic package 300 (and/or the IC devices created using ceramic package 300).

Figure 4A:
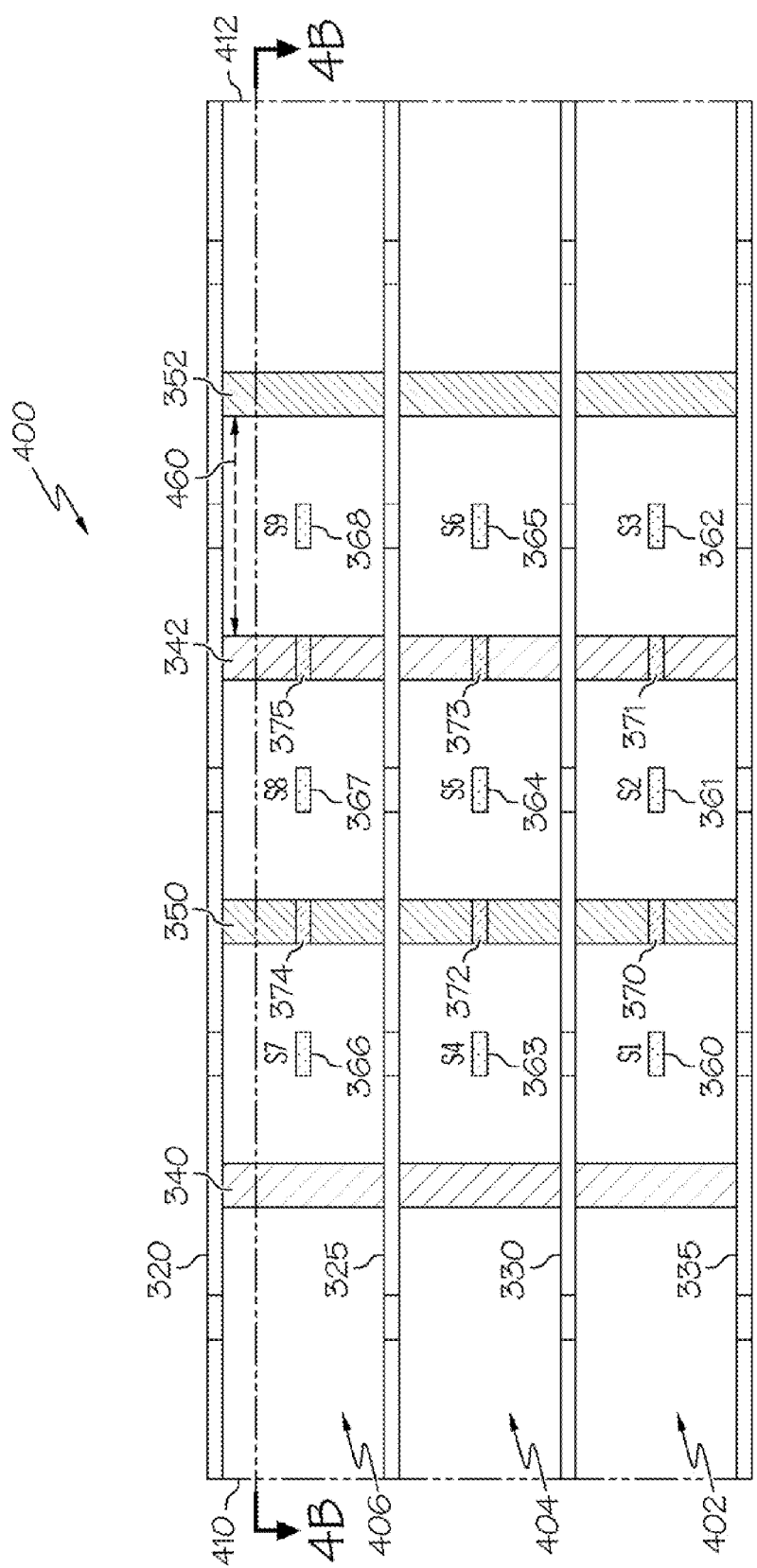
FIG. 4A provides a cross sectional view of the improved ceramic package illustrating the relative placement of VCS lines between signal lines of the wiring/trace layers, according to one embodiment.

With reference now to FIG. 4A, there is depicted a block diagram representation of an example cross-section of a ceramic package similar to example ceramic package 300 of FIG. 3 designed and/or fabricated with VCS structure. Cross sectional view 400 provides mesh planes 320, 325, 330, 335. The edges of the ceramic package in the cross sectional view 400 truncate with first perfect electric conductor (PEC) boundary 410 and second PEC boundary 412. Interspersed between mesh planes are three signal (trace) layers, depicted as first signal layer 402, second signal layer 404 and third signal layer 406. Illustrated within first signal layer 402 are S1 trace 360, S2 trace 361 and S3 trace 362. As utilized herein, the terms signal trace and signal line are utilized interchangeably and are synonymous. Second signal layer 404 comprises S4 trace 363, S5 victim trace 364 and S6 trace 365. Third signal layer 406 comprises S7 trace 366, S8 trace 367 and S9 trace 368. In one embodiment, S5 trace (364) is designated as a victim trace as a result of the central location of S5 trace (364) relative to the other signal traces. By its location relative to the other signal traces, S5 victim trace 364 has the larger set of adjacent signal traces compared with the other signal traces. Also illustrated in cross sectional view 400 is the plurality of vias, which includes first voltage power via 352, first voltage power via 342, second voltage power via 350 and second ground via 340.

Also illustrated in first signal layer 402 and extending adjacent to and in a parallel direction to the three signal traces in first signal layer 402, are first VCS line 370 and second VCS line 371. First VCS line 370 is placed along a first side of S2 trace 361 and second VCS line 371 is placed on a second opposing side of S2 trace 361. With this placement, first VCS line 370 extends between S1 trace 360 and S2 trace 361, while second VCS line 371 extends between S2 trace 361 and S3 trace 362. Similarly, VCS lines 372 and 373 within second signal layer 404, and VCS lines 374 and 375 within third signal layer 406 extend between adjacent signal lines within the particular signal layer. As further illustrated, VCS lines 370-375 each connect to and continues beyond one of a ground or voltage power via which are located near to adjacent signal lines in the directional plane in which the VCS line runs. These configurations of shield lines are thus aptly named via-connected coplanar-type shield lines to indicate the characteristic of the lines being connected to either a ground or voltage power via. Since the VCS lines only extend between adjacent signal lines and (i.e, on opposing sides of) victim traces/lines, no VCS line is illustrated coupled to ground via 340 or to voltage power via 352 because no signal lines are provided to the left of ground via 340 or to the right of voltage power via 352.

Figure 4B:
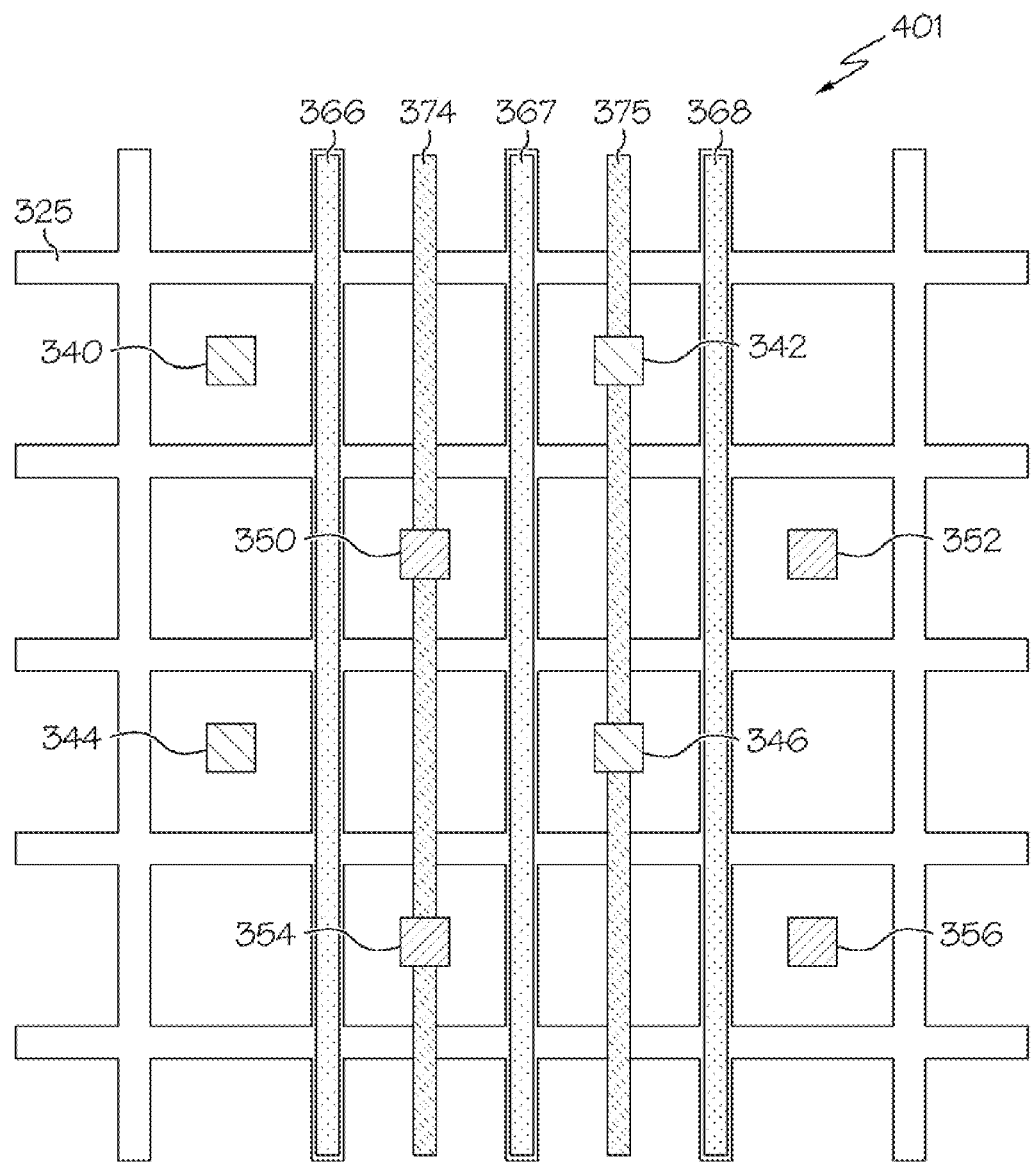
FIG. 4B provides a top (bird's eye) view of the improved ceramic package illustrating the relative placement of VCS lines between signal lines of the wiring/trace layers, according to one embodiment.

FIG. 4B provides a top or bird's eye view of the structural layout of the third signal layer 406 of FIG. 4A. Because of the similarities in the illustrated components, only a cursive description is provided of this view of the VCS configured ceramic package (300). The top view 401 is provided with the first mesh plane (320) layer peeled away to enable clearer presentation of the components within third signal layer 406. Located below third signal layer 406 is mesh plane 325. As shown, within third signal layer 406 are S7 trace 366, S8 trace 367 and S9 trace 368. From this single layer configuration, assuming an xy dimension for the ceramic package, S8 trace 367 would represent the victim trace as a result of the central location of S8 trace 367 relative to the other two signal traces. Also illustrated in top view 401 are the plurality of vias, including four ground vias 340, 342, 344, 346, and four voltage power vias 350, 352, 354, 356. Running alongside the victim trace (S8 trace 367) are VCS lines 374, 375, with each line interconnected to one or more vias located along the directional path in which the particular VCS line extends. Thus, for example, VCS line 374 interconnects with voltage power vias 350 and 354, while VCS line 375 interconnects with ground vias 342 and 346. Also, each VCS line 374, 375 extends along the entire length of the signal line/trace (S8 trace 367) on opposing sides of the signal line/trace (367).

During the design of the above example ceramic packages, Module Crosstalk Reduction (MCR) utility 110 inspects a configuration of signal nets to determine a spatial arrangement of reference vias (i.e., ground vias and source power vias). In ceramic module 300 and cross sectional view 400 or top view 401, inter-via spacing 460 represents the separation distance between a pair of adjacent vias (e.g., second voltage power via 350 and second ground via 340). MCR utility 110 calculates a value for the periodic threshold spacing between adjacent reference vias. Specifically, MCR utility 110 determines a maximum threshold spacing between adjacent vias corresponding to the plurality of signal traces. MCR utility 110 selects a spacing value (i.e., inter-via spacing 460) which is less than the periodic threshold spacing in order to substantially avoid the generation of (or reduce the occurrence of) resonance between adjacent vias.

Referring now to the processes of determining dimensions (length) and placement of coplanar shield lines, MCR utility 110 determines a threshold length of the coplanar shield lines (e.g., first coplanar shield line 241 and second coplanar shield line 243), which corresponds to a minimum length below which crosstalk due to capacitance may occur at certain operating frequencies. At frequencies of interest (i.e., operating frequencies), coplanar shield lines that are longer than the determined threshold length substantially avoids the generation of crosstalk due to capacitance. In addition, MCR utility 110 identifies the length of a signal trace based on a predetermined layout configuration. The use of coplanar shield lines that extend along the entire length of the signal trace (e.g., the victim trace), as opposed to being extended only for a coupled length that is less than the full length of the signal trace, substantially eliminates impedance discontinuities. For example, in one embodiment, S5 trace 364 may be longer than S4 trace 363. The length of third coplanar shield line 372 is selected based only on the length of the longer S5 trace 364 (i.e., the uncoupled length) and does not depend on the (shorter) length of the S4 trace 363. In addition, third coplanar shield line 372 runs parallel to S5 trace 364. Thus, MCR utility 110 selects a (minimum) length for the coplanar shield lines that is at least equal to or greater than (a) the threshold length of the coplanar shield lines and (b) the signal trace length. In addition, MCR utility 110 provides placement of the coplanar shield lines on both sides of a signal trace. Furthermore, MCR utility 110 places the coplanar shield lines so that the coplanar shield lines extend along the entire length of the signal trace.

FIGS. 5A, 5C and 5B, 5D illustrate two comparative configurations of the use of shield lines within ceramic packages to shield adjacent signal lines in a conventional implementation of shielding and an implementation in which VCS shielding is provided. Specifically, FIG. 5A illustrates a single signal line 510 (which is assumed to be a victim line) with two adjacent shield lines 502, 504 both extending a first distance that is shorter than the length of the signal line 510. FIG. 5B illustrates two adjacent signal lines, first signal line 520 and second signal line 522, which run parallel to each other for only a first segment of the first signal line 520. First signal line is assumed to be a victim line. At a point along the length of first signal line 520, second signal line 522 diverges in a different direction from that in which the first signal line continues to run. The configuration of FIG. 5A illustrates a conventional application of shield lines, in which shield lines 502 and 504 do not extend the entire length of the signal line 510. Similarly, with the conventional configuration of FIG. 5B, shield lines 513 and 515 are inserted along a portion of the length of the victim trace 520 (and between the two adjacent signal lines) only to the point along the first signal line (520) at which second signal line 522 diverges away from the direction in which first signal line 520 runs. These two conventional approaches cause changes in impedance characteristics at the point at which the shield lines stop running, resulting in impedance discontinuity. The impedance discontinuity then causes the ceramic package to exhibit negative signal propagation characteristics, including undesirable feedback and crosstalk (due to noise coupling) within the ceramic package and/or also within any devices manufactured with the ceramic package.

With the process provided by the MCR utility 110 and the use of the VCS structure, shield lines 506, 508 and 517, 519 are provided along the entire length of the longest signal lines (and/or victim lines) and in parallel to the longest signal line, as shown by FIGS. 5C and 5D. This application of VCS structure occurs regardless of whether the signal lines continue to run parallel to each other. With the illustration of FIGS. 5C and 5D, the VCS lines (506, 508 and 517, 519) thus extend at least the threshold minimum length calculated by the MCR utility 110.

Thus, MCR utility 110 reduces coupling noise by laying shielded lines between the signal lines. The placement of the VCS structure between the signal lines blocks the electric field and magnetic field between the signal lines, which reduces mutual capacitance and mutual inductance between the signal lines, and ultimately reduces crosstalk between the signal lines. MCR utility 110 selects a layout configuration in which (1) these VCS lines are alternately connected to ground and Vdd vias and (2) every signal layer of the ceramic module is hosted by a mesh plane that is also alternately connected to ground and Vdd vias.

In one embodiment, MCR utility 110 selects an orthogonal placement of the coplanar shield lines. In particular, MCR utility 110 places a first shield line in a first layer, "x", orthogonal to a second/adjacent shield line in a second layer "y", according to an "xy" configuration of trace layers. The "xy" layer configuration describes a perpendicular arrangement of adjacent signal layers. In this configuration, the reference vias are arranged so that the vias from a first power distribution side are interstitially placed relative to other vias from a second power distribution side. In this "xy" configuration, MCR utility 110 facilitates the capacitive coupling of uneven reference return currents associated with xy vias.

With the designed methodology described herein and using the VCS structure, measurable improvements in the near end (NE) and far end (FE) noise characteristics are observed within example ceramic package (300). Table I below illustrates a noise coupling comparison for the layout configurations with and without the Via-connected Coplanar-type Shield (VCS) structure, according to one embodiment.

TABLE I

| Configuration | Maximum NE (near end) noise [mV] | Maximum absolute FE (far end) noise [mV] |
| --- | --- | --- |
| Config. without VCS structure | 21.8 | 50.4 |
| Config. with VCS structure | 11.7 | 18.7 |

As shown, Table I comprises three columns: (a) configuration column, Maximum NE (near end) noise column and Maximum absolute FE (far end) noise column. Table I provides coupling noise results for two distinct configurations shown via the rows of the table. First configuration row provides results for a configuration which does not employ the VCS structure and second configuration row provides results for a configuration which employs the VCS structure. The configurations are computer generated and then executed in a Power SPICE simulator to provide a noise coupling comparison. A one volt (1 V) ramp source with 75 pico-second (psec) rise time is applied to inputs of signal lines S1, S2, S3, S4, S6, S7, S8, and S9. The signal net S5 (see FIG. 4) was chosen as a victim net in the simulation. The inputs and outputs of these signal lines are terminated with 50 ohm resistors.

Table I shows near end (NE) coupling noise effects on S5 victim signal net 364 due to all 8 aggressor nets for the configuration without and with VCS structure. Table I shows that the maximum NE noise voltage is reduced greatly by the VCS structure (46% reduction in this case). This is because the VCS structure between signal lines blocks electric field and magnetic field between signal lines, which reduces mutual capacitance and mutual inductance between the signal lines, which ultimately reduces crosstalk between the signal lines.

In addition, Table I shows far end (FE) coupling noise effects on S5 victim signal net 220 due to all aggressor nets for the structures with and without the VCS structures. In ceramic packages, FE noise is typically much greater than NE noise, and reduction in FE noise is therefore a desired goal during design and fabrication of ceramic packages. Table I shows that the maximum FE noise voltage is reduced significantly by the VCS structures (63% reduction in this case), which is critical for system performance.

Table II below illustrates a characteristic impedance comparison for a victim signal line within the ceramic package without and with the VCS structure, according to one embodiment.

TABLE II

| Configuration | Characteristic impedance [ohm] |
| --- | --- |
| Config. without VCS structure | 45.5 |
| Config. with VCS structure | 45.1 |

Table II comprises: (a) configuration (type) column; and (b) characteristic impedance column. Table II provides impedance results for two distinct configurations shown via the rows of the table. The first configuration row provides results for a configuration which does not employ the VCS structure and the second configuration row provides results for a configuration which employs the VCS structure. Again, the configurations are computer generated and then executed in a Power SPICE simulator. Table II shows characteristic impedance comparison for a victim signal line (S5), in a configuration without and with the VCS structure. Table II shows that characteristic impedances for the structure without and with the VCS structure are almost the same. This is because the VCS structure mainly affects mutual capacitance and mutual inductance between the signal lines. However, the VCS structure also does slightly affect self capacitance and self inductance of the signal line.

Finally, Table III below illustrates a noise coupling comparison for a layout configuration with metal fillings in the mesh plane and a layout configuration with the VCS structure, according to one embodiment.

TABLE III

| Configuration | Maximum NE (near end) noise [mV] | Maximum absolute FE (far end) noise [mV] |
| --- | --- | --- |
| Config. Employing metal fillings in mesh planes | 14.1 | 23.1 |
| Config. Employing co-planar shielding (VCS) structure | 11.7 | 18.7 |

As provided, Table III comprises configuration column, Maximum NE (near end) noise column, and Maximum absolute FE (far end) noise column. Table III provides coupling noise results for two distinct configurations shown via the rows of the table. First configuration row provides results for a configuration which employs metal fillings within a mesh plane and second configuration row provides results for a configuration which employs the VCS structure. As with the previous tables, the configurations are computer generated and then executed in a simulator to provide a noise coupling comparison. A one volt (1 V) ramp source with 75 pico-second (psec) rise time is applied to inputs of signal lines S1, S2, S3, S4, S6, S7, S8, and S9. The signal net S5 is chosen as a victim net in the simulation. The inputs and outputs of these signal lines are terminated with 50 ohm resistors.

Table III shows near end (NE) coupling noise effects on S5 victim signal net 364 (FIG. 4) due to all eight aggressor nets for the configuration with metal fillings and with Via-connected Coplanar-type Shield (VCS) structure. Table III shows that the maximum NE noise voltage is reduced by the VCS structure (17% reduction in this case). In addition, Table III provides far end (FE) coupling noise effects on S5 victim signal net 220 due to all aggressor nets for the structures with metal fillings and with the VCS structures. Table III shows that the maximum FE noise voltage is reduced by the VCS structures (19% reduction in this case).

In addition to the observed noise reduction, use of the VCS structures within the ceramic packages does not violate metal loading limit in ceramic packages. Therefore, the use of the VCS structure provides greater noise reduction in real ceramic packages than the method which uses metal fillings within the mesh plane.

FIG. 6A is a graph which illustrates a comparison of NE (near end) noise waveforms on the victim signal net (e.g., signal trace 5 364 of FIG. 3 or 4) due to all 8 aggressor nets for: (1) a first conventionally designed ceramic package (such as one designed with shield metal on the mesh plane); and (2) an example ceramic package designed with Via-connected Coplanar-type Shield (VCS) structure, according to one embodiment. Graph 600 depicts first NE (far end) noise waveform 602 resulting from a trace configuration having a VCS structure. Graph 600 also depicts second NE (far end) noise waveform 604 resulting from a trace configuration without the VCS structure. A comparison of first NE noise waveform 602 and second NE noise waveform 604 shows that the maximum NE noise voltage is reduced greatly by the VCS structure (46% reduction in the case of graph 600). The model with the VCS structure achieves significant noise reduction because the VCS structure placed between the signal lines block electric field and magnetic field between signal lines. As a result, mutual capacitance and mutual inductance are reduced between the signal lines, which ultimately reduce crosstalk between the signal lines.

FIG. 6B is a graph which depicts a comparison of FE (far end) noise waveforms on the victim signal net (e.g., signal trace 5 364 of FIG. 3 or 4) due to all 8 aggressor nets for: (1) a first conventionally designed ceramic package (such as one designed with shield metal on the mesh plane); and (2) an example ceramic package designed with Via-connected Coplanar-type Shield (VCS) structure, according to one embodiment. Graph 620 depicts first FE (far end) noise waveform 622 resulting from a trace configuration having a VCS structure. In addition, graph 620 depicts second FE (far end) noise waveform 624 resulting from a trace configuration without the VCS structure. A comparison of first FE noise waveform 622 and second FE noise waveform 624 shows that the maximum FE noise voltage is reduced significantly by the VCS structures (i.e., 63% reduction in the case of graph 620), which noise reduction is critical for performance of the ceramic package and/or ICs fabricated from the ceramic package.

FIG. 7 is a flow chart illustrating the method by which the above processes of the illustrative embodiments are completed. In particular, FIG. 7 illustrates the process of designing a ceramic package with VCS structures to reduce coupling noise and control impedance discontinuity in the wire trace configuration for the ceramic package. Although the method illustrated in FIG. 7 may be described with reference to components shown in FIG. 1 and FIGS. 3-5, it should be understood that this is merely for convenience and alternative components and/or configurations thereof can be employed when implementing the method. Key portions of the method may be completed by MCR utility 110 executing on a processor (e.g., Processor 102 within DPS 100 (FIG. 1) and controlling specific operations of/on DPS 100. The method is thus described from the perspective of either/both MCR utility 110 and DPS 100.

The process of FIG. 7 begins at initiator block 702 and proceeds to block 704, at which Module Crosstalk Reduction (MCR) utility 110 inspects a configuration of signal nets to determine a spatial arrangement of reference vias. At block 706, MCR utility 110 calculates a maximum threshold spacing between adjacent vias. At block 708, MCR utility 110 selects a layout arrangement which separates adjacent vias by less than the threshold spacing. This threshold spacing is factored into the configuration of the mesh layers, such that the pitch of the mesh layers is less than the threshold spacing. At block 710, MCR utility 110 determines the threshold length of coplanar shield lines. At block 712, MCR utility 110 identifies the length of signal traces. At block 714, MCR utility 110 selects the length of the coplanar shield lines to be no less than the threshold length and no less than the length of the signal trace. At block 716, MCR utility 110 selects placement of the coplanar shield lines on both sides of each signal trace. At block 718, MCR utility 110 provides the trace layout design of the ceramic package configured with the VCS structure to a fabrication system. The fabrication system then generates/fabricates the enhanced ceramic package with the VCS structure based on the layout/design generated by the MCR utility, as shown at block 720. The process ends at block 722.

In the flow chart above, certain processes of the methods are combined, performed simultaneously or in a different order, or perhaps omitted, without deviating from the spirit and scope of the invention. Thus, while the method processes are described and illustrated in a particular sequence, use of a specific sequence of processes is not meant to imply any limitations on the invention. Changes may be made with regards to the sequence of processes without departing from the spirit or scope of the present invention. Use of a particular sequence is therefore, not to be taken in a limiting sense, and the scope of the present invention extends to the appended claims and equivalents thereof.

As will be appreciated by one skilled in the art, the software aspects of the present invention may be embodied as a method and/or logic within a computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module," "logic," or "system." Furthermore, the present invention may take the form of a computer program product on a computer-usable storage medium having computer-usable program code embodied in or on the medium.

Accordingly, and as described in detail above, the method or program product implementation of the embodiment provides a fabrication system for a ceramic package, in which a method for reducing coupling noise and controlling impedance discontinuity in ceramic packages is implemented. The method comprises: providing at least one reference mesh layer; providing a plurality of signal trace layers, each signal layer having one or more signal traces/lines and the mesh layer is adjacent to one or more signal layers of the plurality of signal layers; disposing a plurality of vias at periodic locations within the at least one reference mesh layer with each via providing one of a voltage (Vdd) power connection or a ground (Gnd) connection; and selectively placing a plurality of via-connected coplanar-type shield (VCS) lines relative to the one or more signal lines, with a first coplanar shield line extending on a first side of a first signal line within the plurality of signal layers and a second coplanar shield line extending on a second opposing side of said first signal line. Each of the plurality of coplanar shield lines interconnect with and extend past one or more vias of the plurality of vias located along a directional plane in which the coplanar shield lines extends.

Additionally, the method and program product provides the functions of: determining a maximum threshold spacing between adjacent vias corresponding to the plurality of signal traces; providing a configuration of wiring/trace layers which separates adjacent vias by less than the maximum threshold spacing; a processor of the fabrication system executing a Module Crosstalk Reduction (MCR) utility, which calculates a threshold length of the coplanar shield lines; and selecting a minimum length for the coplanar shield lines based on the threshold length. Selectively placing a plurality of VCS lines further includes placing a first coplanar shield line of at least the minimum length on a first side of a signal trace within the plurality of signal traces and a second coplanar shield line also of at least the minimum length on a second opposing side of said signal trace. Also, the first coplanar shield line and the second coplanar shield line are placed parallel to the signal trace.

As will be further appreciated, the processes in embodiments of the present invention may be implemented using any combination of software, firmware, microcode, or hardware. As a preparatory step to practicing the invention in software, the programming code (whether software or firmware) will typically be stored in one or more machine readable storage mediums such as fixed (hard) drives, diskettes, magnetic disks, optical disks, magnetic tape, semiconductor memories such as RAMs, ROMs, PROMs, etc., thereby making an article of manufacture in accordance with the invention. The article of manufacture containing the programming code is used by either executing the code directly from the storage device, by copying the code from the storage device into another storage device such as memory 106 of DPS 100 (FIG. 1) or a hard disk, etc., or by transmitting the code for remote execution using transmission type media such as digital and analog communication links. The medium may be electronic, magnetic, optical, electromagnetic, infrared, or semiconductor system (or apparatus or device) or a propagation medium. Further, the medium may be any apparatus that may contain, store, communicate, propagate, or transport the program for use by or in connection with the execution system, apparatus, or device. The methods of the invention may be practiced by combining one or more machine-readable storage devices containing the code according to the described embodiment(s) with appropriate processing hardware to execute the code contained therein. An apparatus for practicing the invention could be one or more processing devices and storage systems containing or having network access (via servers) to program(s) coded in accordance with the invention. In general, the term computer, computer system, or data processing system can be broadly defined to encompass any device having a processor (or processing unit) which executes instructions/code from a memory medium.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A multi-layered ceramic package comprising:
   a plurality of signal layers, each signal layer having one or more signal lines;
   a plurality of vias disposed within the ceramic package with each via providing one of a voltage (Vdd) power connection or a ground (Gnd) connection;
   at least one reference mesh layer adjacent to one or more signal layers of the plurality of signal layers, wherein each of the at least one reference mesh layer is connected to either a voltage power connection or a ground connection; and
   a plurality of via-connected coplanar-type shield (VCS) lines, with a first VCS line extended along a first side of a first signal line within one of the plurality of signal layers and a second VCS line extended along a second opposing side of said first signal line, wherein the plurality of VCS lines extend only between two adjacent signal lines;
   wherein each of the plurality of VCS lines interconnects with and extends past one or more vias of the plurality of vias that extend across a directional path along which the VCS line extends.

2. The multi-layered ceramic package of claim 1, wherein a periodicity of the interconnection of VCS lines with one or more select vias among the plurality of vias provides a reduced noise coupling between interconnects in the ceramic package.

3. The multi-layered ceramic package of claim 1, wherein each of the plurality of VCS lines extends at least a first threshold length relative to a length of one or more adjacent signal lines, wherein the first threshold length is a length at which noise coupling between adjacent signal lines is substantially reduced and impedance discontinuity is controlled.

4. The multi-layered ceramic package of claim 1, wherein:
   the plurality of vias extend perpendicularly through one or more signal layers of the plurality of signal layers and one or more reference mesh layers of the plurality of reference mesh layers; and
   each via coupled to a VCS line is separated from a next adjacent via by less than a predetermined maximum threshold spacing at which a resonance due to the plurality of vias is substantially eliminated.

5. The multi-layered ceramic package of claim 1, wherein each of the plurality of VCS lines extend in a parallel direction along the entire length of a signal line being shielded by the VCS line.

6. The multi-layered ceramic package of claim 1, wherein the plurality of VCS lines extend orthogonally between layers in an xy plane pair structure.

7. The multi-layered ceramic package of claim 1, wherein the plurality of VCS lines located between the signal lines block electric field and magnetic fields between the signal lines and reduces mutual capacitance and mutual inductance between the signal lines, which further reduces crosstalk between the signal lines.

8. The multi-layered ceramic package of claim 1, wherein the multi-layered ceramic package is a glass-ceramic package.

9. An integrated circuit manufactured using the multi-layered ceramic package of claim 1.

10. The multi-layered ceramic package of claim 1, wherein each VCS line in the plurality of VCS lines is placed parallel to adjacent signal lines.

11. The multi-layered ceramic package of claim 1, wherein a VCS line is placed on both sides of each signal trace.

12. The multi-layered ceramic package of claim 3, wherein the first threshold length is greater than or equal to the length of the one or more adjacent signal lines.

13. The multi-layered ceramic package of claim 1, wherein each VCS line in the plurality of VCS lines is alternately connected to one of a power connection and a ground connection.

* * * * *